(12) United States Patent  
Eida et al.

(10) Patent No.: US 8,328,944 B2  
(45) Date of Patent: Dec. 11, 2012

(54) WEIGHT PLATE OF VACUUM EVAPORATION APPARATUS AND VACUUM EVAPORATION APPARATUS USING THE SAME

(75) Inventors: Masataka Eida, Toride (JP); Takehiko Soda, Yokohama (JP); Kazushi Miyata, Mobara (JP)

(73) Assignees: Canon Kabushiki Kaisha, Tokyo (JP); Hitachi Displays, Ltd., Chiba-ken (JP)

( * ) Notice: Subject to any disclaimer, the term of this patent is extended or adjusted under 35 U.S.C. 154(b) by 339 days.

(21) Appl. No.: 12/707,883

(22) Filed: Feb. 18, 2010

(65) Prior Publication Data

US 2010/0212596 A1    Aug. 26, 2010

(30) Foreign Application Priority Data

Feb. 26, 2009   (JP) ................. 2009-043436

(51) Int. Cl.  
    *C23C 14/24*   (2006.01)
(52) U.S. Cl. ......... 118/726; 118/721; 118/504; 118/718
(58) Field of Classification Search .................. 118/726, 118/721, 504, 503, 718; 414/935, 936, 937, 414/938, 939, 940; 204/298.11, 298.25; 219/121.15

See application file for complete search history.

(56) References Cited

U.S. PATENT DOCUMENTS

2010/0212596 A1 * 8/2010 Eida et al. ............. 118/729

FOREIGN PATENT DOCUMENTS

JP        2007046099 A    2/2007

OTHER PUBLICATIONS

Machine Generated English Translation of JP 2007-046099 published Feb. 22, 2007.*

* cited by examiner

*Primary Examiner* — Sylvia R. MacArthur  
(74) *Attorney, Agent, or Firm* — Fitzpatrick, Cella, Harper & Scinto

(57) ABSTRACT

A vacuum evaporation apparatus includes an evaporation source, a combined conveyance body in which a glass substrate is superposed and aligned on a shadow mask fixed to a holding member, and a weight plate placed on the glass substrate presses the glass substrate to the shadow mask by gravity for holding the glass substrate, and a convey mechanism for conveying the combined conveyance body. The weight plate includes a shock absorbing member for absorbing an impact applied to the combined conveyance body in an in-plane direction of the glass substrate. The shock absorbing member includes a sliding body connected to the weight plate via a spring and having multiple recesses formed in a surface of the sliding body facing the glass substrate, and includes slide balls disposed in the multiple recesses.

7 Claims, 10 Drawing Sheets

WEIGHT PLATE OF VACUUM EVAPORATION APPARATUS AND VACUUM EVAPORATION APPARATUS USING THE SAME

BACKGROUND OF THE INVENTION

1. Field of the Invention

The present invention relates to a weight plate of a vacuum evaporation apparatus for pressing by gravity so as to prevent displacement between a shadow mask and a glass substrate that are superposed and aligned in a vacuum evaporation apparatus, and to the vacuum evaporation apparatus using the same.

2. Description of the Related Art

In a production process of an organic EL panel that supports full color light emission, red (R), green (G), and blue (B) color elements are formed on a glass substrate by a vacuum evaporation process using a shadow mask.

A method which is widely adopted for forming the color element of each color includes the steps of making shadow masks for individual RGB colors, aligning the shadow mask for each color, and performing vacuum evaporation on the glass substrate.

The shadow mask and the glass substrate are fixed with a holding member and conveyed through a plurality of film forming apparatuses. In the conveying process, the shadow mask and the glass substrate may receive various physical external stresses when using a lifting gear, a roller acceleration/deceleration gear, a belt conveyer, a robot conveyer, and the like. Therefore, their impact force may cause displacement between the shadow mask and the glass substrate, and the positional accuracy thereof may deviate from a target value, thereby resulting in various problems such as color shift, color irregularity, no emission, and the like.

A feature of the production apparatus of an inline production method or the like for the organic EL panel is an improvement of production capacity and reduction of production cost in a continuous mass production form, and it is important how to increase convey speed of the glass substrate so that the production capacity and the operating rate is improved.

In the production apparatus of the inline production method for the organic EL panel, various economic convey mechanisms and units such as a robot conveyer, a roller conveyer, and a belt conveyer are used. When those convey mechanisms are used and intended to increase in convey speed of the substrate, an impact or a vibration occurs due to the acceleration or deceleration.

In addition, the substrate holder is a metal rigid body and has a larger mass than the substrate has. For instance, it is found that a negative acceleration of approximately 1 to 10 m/sec$^2$ is generated at a moment when the moving combined structural member of the shadow mask and the glass substrate including the substrate holder contacts a roller or a conveyer stop portion and is stopped. If the negative acceleration of such an extent is applied to an object having a large mass, impact force of the extent corresponding to a product of the mass and the negative acceleration is exerted, and hence the displacement may occur at a level of 3 to 8 μm. On the other hand, the substrate is usually a thin glass plate having a thickness of 1 mm or less and has a small mass. Therefore, the impact force is small for the substrate even if the same negative acceleration is exerted. A difference of the impact forces applied to the substrate holder and the substrate may cause a displacement.

A substrate holder that may solve such problem is disclosed in Japanese Patent Application Laid-Open No. 2007-046099. As illustrated in FIG. 15, the substrate holder includes a mask holder 5 for holding a shadow mask 6, which is provided with a friction pad 2, and a substrate holder 3 for holding a substrate 4, which is provided with a friction pad 17. The friction pad 2 and the friction pad 17 are disposed at positions so as to contact each other and are made of rubber or elastomer.

Thus, the friction force between a fringe part of clamping the mask holder 5 and the substrate holder 3 with a clamper 7 so as to hold the shadow mask 6 and a fringe part of holding the substrate 4 is increased, to thereby prevent a relative displacement between the shadow mask and the glass substrate.

Furthermore, the shadow mask is fixed to the mask holder 5 by magnetic attractive force using a magnet or the like.

However, magnetic force may cause an image disturbance in the production process of the organic EL panel. In particular, it is said that if a stripe mask is used, magnetic lines of flux are generated so that a distance between the stripe masks varies, resulting in an image disturbance due to a displacement of a film forming position of an organic light emission film.

SUMMARY OF THE INVENTION

It is an object of the present invention to provide a weight plate of a vacuum evaporation apparatus that may hold a positional relationship between a shadow mask and a glass substrate after superposing and aligning the shadow mask and the glass substrate, and may prevent occurrence of a displacement between the shadow mask and the glass substrate due to a vibration or an impact during conveyance by a convey mechanism.

In order to achieve the above-mentioned object, provided is a vacuum evaporation apparatus including; an evaporation source, a combined conveyance body in which a glass substrate is superposed and aligned on a shadow mask fixed to a holding member, and a weight plate placed on the glass substrate presses the glass substrate to the shadow mask by gravity for holding the glass substrate, and a convey mechanism for conveying the combined conveyance body, in which the weight plate includes a shock absorbing member for absorbing an impact applied to the combined conveyance body in an in-plane direction of the glass substrate.

The present invention having the above-mentioned structure may provide the following effect.

The weight plate is placed on the glass substrate that is superposed and aligned on the shadow mask that is fixed to the mask holding member. This weight plate has a shock absorbing unit for reducing an impact due to conveyance in the in-plane direction of the substrate, and forms a combined conveyance body by pressing the glass substrate to the shadow mask to hold the glass substrate by gravity. As a result, it is possible to reduce a vibration or an impact due to a collision or the like, and hence occurrence of a displacement between the shadow mask and the glass substrate may be prevented.

Further features of the present invention will become apparent from the following description of exemplary embodiments with reference to the attached drawings.

DESCRIPTION OF THE EMBODIMENTS

Exemplary embodiments of the present invention are described with reference to the attached drawings.

Figure 1:
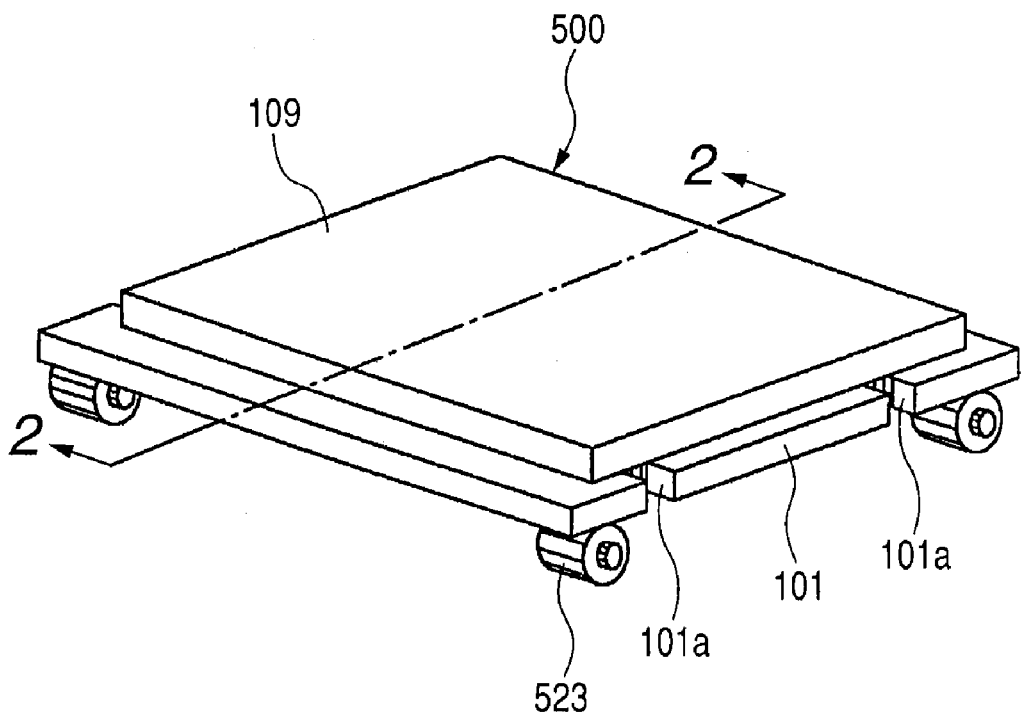
FIG. 1 is a perspective view illustrating a weight plate according to a first embodiment.
Figure 2:
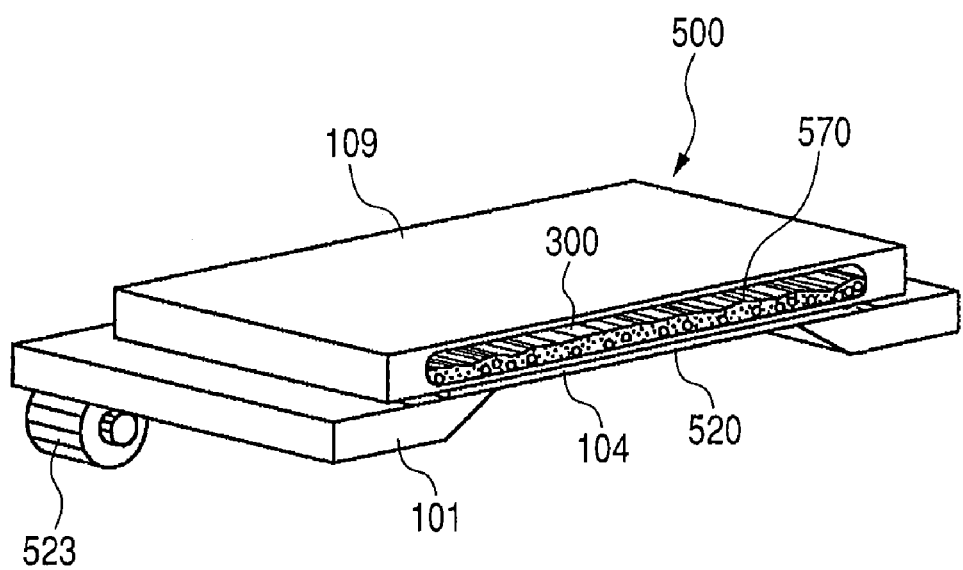
FIG. 2 is a partial cross sectional perspective view cut along the line 2-2 of FIG. 1.

FIGS. 1 and 2 illustrate a weight plate according to a first embodiment. In a vacuum evaporation apparatus for performing vacuum evaporation, a combined conveyance body 500 is placed on a conveyor roller 523 as a convey mechanism. Under a weight plate 109, a glass substrate 104 on which TFTs are formed is placed in a state sandwiched between a tension mask 520 and the weight plate 109. The tension mask 520 is provided with fine pores 520a for transmitting organic EL evaporation particles 555 (see FIG. 11), which are aligned and arranged with an accuracy of ±2 μm or smaller with respect to the pixels of the TFTs.

After finishing the alignment, the combined conveyance body 500 is conveyed to the conveyance chamber. At this time, acceleration is applied to the combined conveyance body 500 by rotation of the roller 523. In this case, if the weight plate 109 is a simple rigid metal without the shock absorbing unit, the impact force of acceleration applied to the weight plate is transferred to the glass substrate 104 so that a displacement occurs in an in-plane direction of the glass substrate 104 between the glass substrate 104 and the tension mask 520.

However, the weight plate according to the present invention is provided with the shock absorbing unit like the first embodiment illustrated in FIGS. 1 and 2. The weight plate 109 has a hollow part 300, and a liquid metal 570 such as gallium or mercury is filled with a filling factor of from more than 25% to less than 85% inside the hollow part 300. In other words, the impact is reduced by fluidity of the liquid metal 570.

The above-mentioned optimal value of the filling factor is found by the following experiment.

As the experiment, a hollow space was formed inside the weight plate made of aluminum, and a liquid metal of gallium was filled in the hollow space with different filling factors. Then, the weight plate was conveyed at a constant speed at 0.1 m/sec in the apparatus, while a displacement between an alignment mark of the glass substrate and an alignment mark of the mask in the in-plane direction of the glass substrate was measured. As a result, the displacement was ±0.2 μm or smaller before and after the conveyance in the case when the filling factor is 30%, 45%, 65%, or 80%. On the other hand, if the filling factor of the liquid metal is 0%, 10%, or 25%, the displacement of the alignment mark was larger than ±0.2 μm. In addition, if the filling factor of the liquid metal inside the hollow space is 85%, 90%, or 100%, the displacement was larger than ±0.2 μm.

When moving in a constant direction at a constant speed, a vibration or an impact must not occur inherently. However, it is considered that a displacement of the conveyor roller or a vibration of an external apparatus causes various vibrations or impacts during the conveyance step, thereby resulting in the displacement.

A limit of measurement of visible light that is used in the optical measurement of the alignment position is ±0.2 μm. In other words, if the degree of the displacement is within the range of ±0.2 μm, it may be considered that the displacement is a measurement error and that no displacement is generated in reality. In addition, if the displacement is larger than ±0.2 μm, it is apparent that the displacement is actually generated.

From the above-mentioned results, it is found that various vibrations and impacts are generated to cause a displacement in the in-plane direction of the glass substrate when the combined structural member is conveyed and that, however, the displacement may be reduced by forming a hollow inner space and providing a mechanism that hardly follow the vibration or the impact during the conveyance in the hollow inner space.

Figure 3:
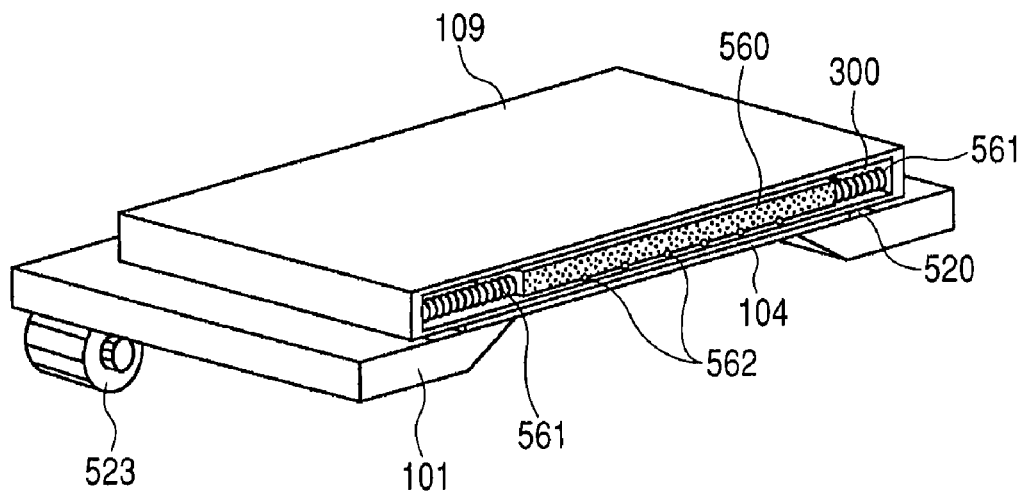
FIG. 3 is a partial cross sectional perspective view of a weight plate according to a second embodiment.

FIG. 3 illustrates a weight plate according to a second embodiment. The weight plate 109 has the hollow part 300, and, in the hollow part 300, a sliding body 560 is disposed so that the sliding body 560 is connected via springs 561 for reducing impact between inner wall surfaces of the hollow part. The springs 561 are illustrated at only the right and the left in FIG. 3, but they may be disposed also in the front and rear direction (in the direction of the front face and the back face in FIG. 3). Alternatively, if there may be conveyance and collision in the vertical direction, the springs may be disposed in the vertical direction.

In addition, if the sliding body 560 is enclosed and shielded completely in the weight plate 109, the springs 561 which are used inside the weight plate 109 may be made of an organic material (e.g., polyurethane resin, polyethylene, and the like) that is apt to generate gas or a flexible member made of rubber material or the like. In addition, a shape thereof may be one that is not a spring shape but may complement the spring function.

Slide balls for smooth slide (metal balls for a ball bearing) 562 are disposed between the sliding body 560 and the hollow part inner wall surface of the weight plate 109. The slide balls reduce friction between the sliding body 560 and the hollow part bottom surface of the weight plate. Therefore, instead of the slide balls, it is possible to adopt other unit such that surfaces contacting to each other are made to be surfaces having a low coefficient of friction by coating with suspension plating of polytetrafluoroethylene particles or coating with a fluorocarbon resin. Thus, even if a light impact occurs when striking positioning is performed in the acceleration or deceleration step by rotation of the roller 523 or other steps, the impact may be reduced. In other words, if the slide balls 562 and the spring constant are set appropriately, it is possible to control the displacement between the tension mask 520 and the glass substrate 104 to be ±0.2 μm or smaller.

Figure 4:
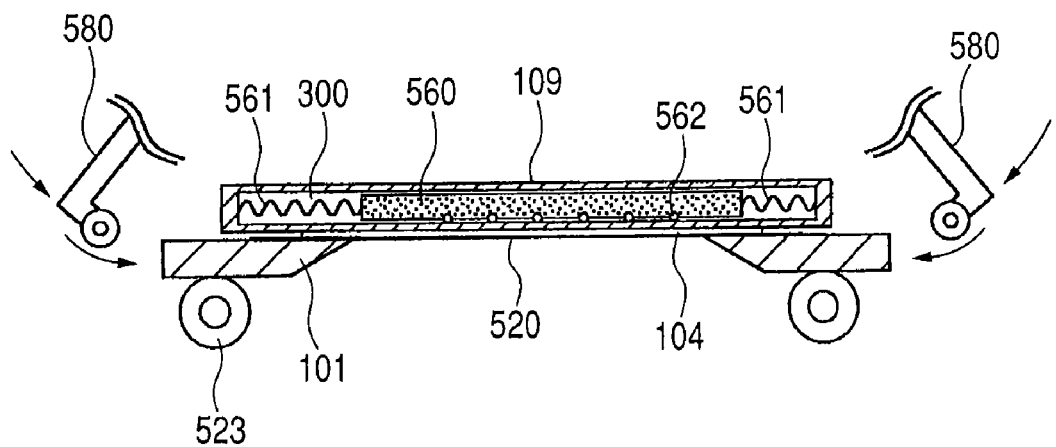
FIG. 4 is a cross sectional view illustrating the weight plate and a rotation clutch according to the second embodiment.

FIG. 4 is an explanatory diagram illustrating a positioning mechanism by a rotation clutch. This positioning is performed by sandwiching the combined conveyance body 500 from the front and the rear with rotation clutches 580 instantaneously. In the state after this positioning, the conveyance movement or a movement in other direction is performed by a robot or the like.

Figure 5:
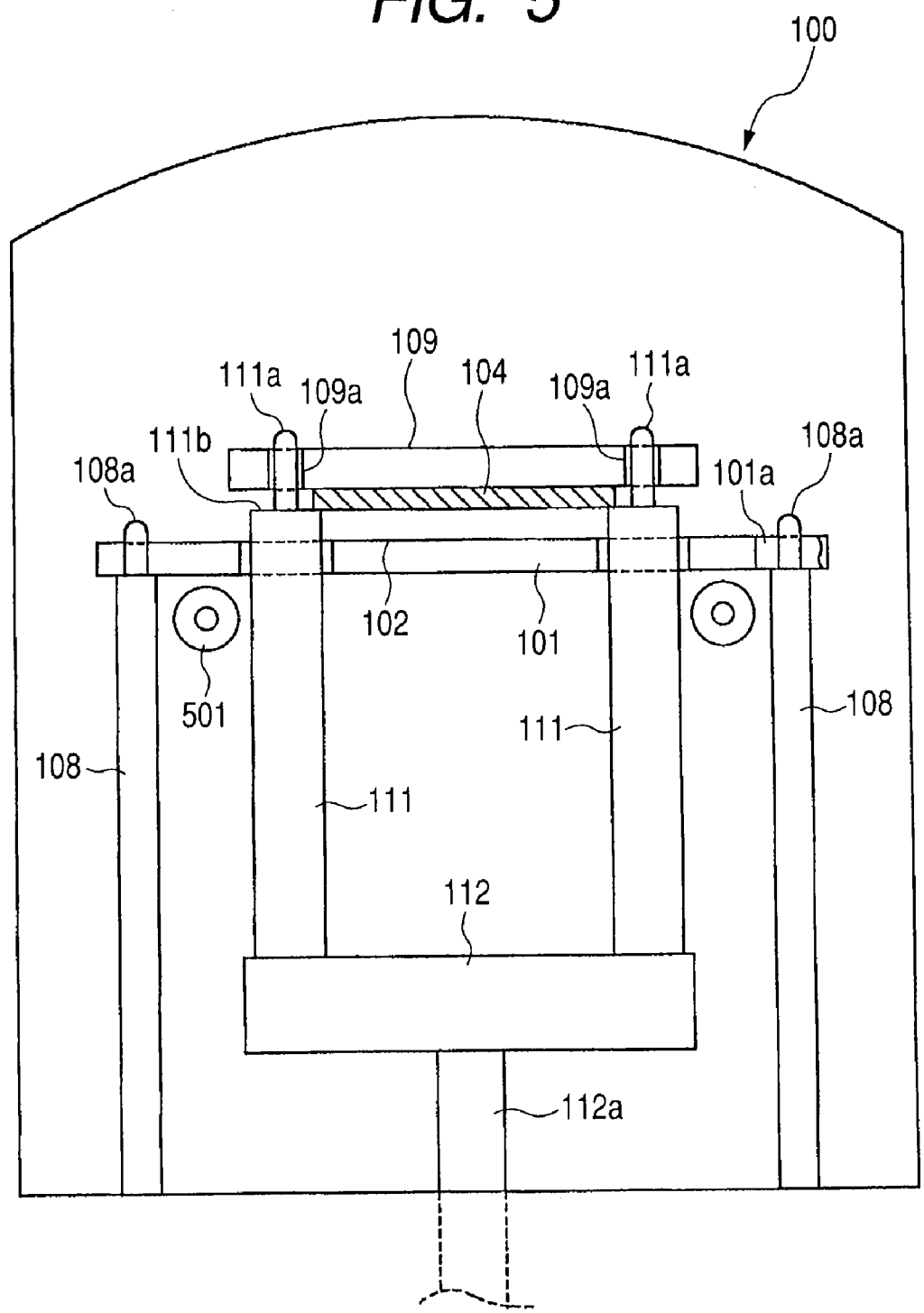
FIG. 5 is an explanatory diagram illustrating a step of alignment of a combined conveyance body.

FIG. 5 is a schematic explanatory diagram illustrating an alignment mechanism for aligning the glass substrate and a shadow mask.

The weight plate 109 is placed on the glass substrate 104 in the state where small diameter parts 111*a* of rods 111 at the upper end in FIG. 5 are inserted in temporary positioning holes 109*a*. This operation is described in detail as follows. The glass substrate 104 is held by the rods 111 at step parts 111*b* of the rods 111 and may perform alignment movement by linking mechanically together with movement of an alignment moving post 112.

The weight plate 109 is placed on the glass substrate 104 so that the small diameter parts 111*a* of the rods 111 are inserted in the temporary positioning holes 109*a* of the weight plate 109 by using a robot arm (not shown). Note that the temporary positioning holes 109*a* of the weight plate 109 are used in this embodiment. However, it is possible to perform the positioning to some extent of accuracy without using the temporary positioning holes 109*a* but by using the robot.

In this state, alignment moving post 112 is moved for performing the alignment so that an alignment mark (not shown) disposed in the shadow mask 102 and an alignment mark (not shown) disposed in the glass substrate 104 are opposed to each other in a predetermined positional relationship.

Figure 6:
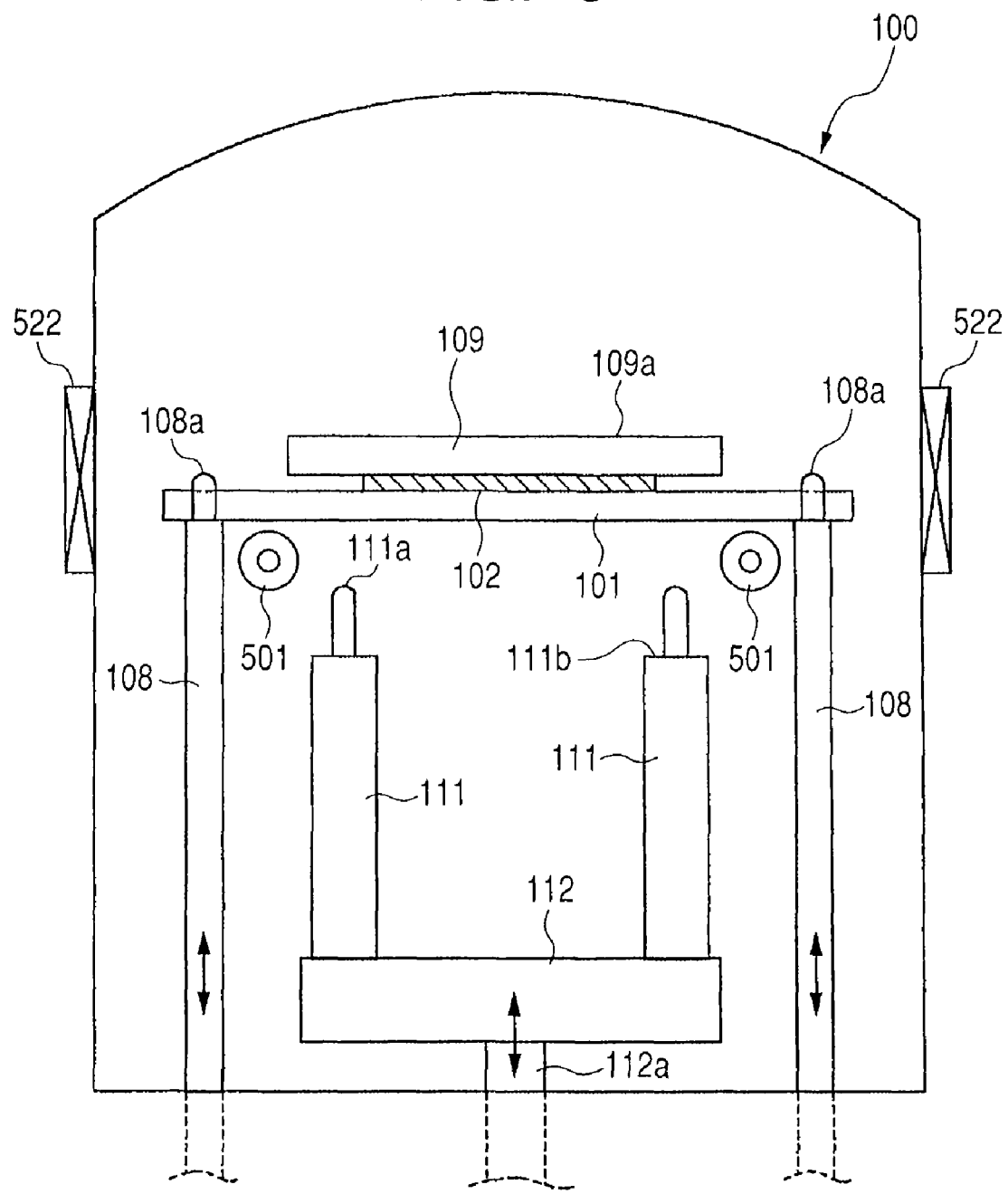
FIG. 6 is a diagram illustrating the state where the shadow mask and the glass substrate contact each other after the step illustrated in FIG. 5.
Figure 7:
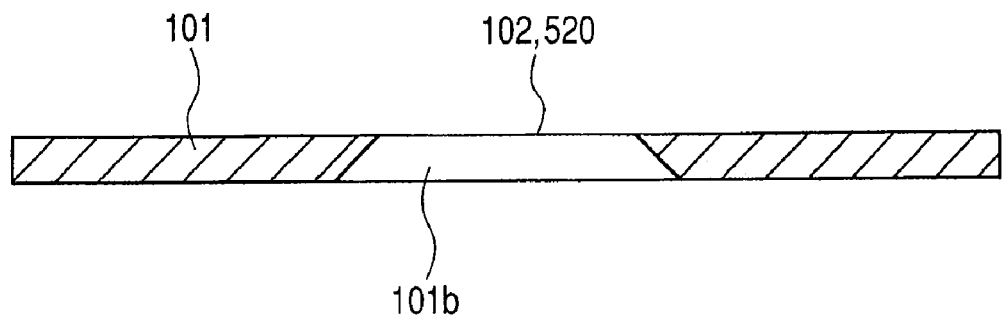
FIG. 7 is a schematic cross sectional view illustrating an example of a mask holding member and the shadow mask.

After that, the alignment moving post 112 is lowered to be the state as illustrated in FIG. 6. In other words, the combined conveyance body 500 is formed, in which the glass substrate 104 and the weight plate 109 are placed on the shadow mask 102 and a mask holding member 101.

Note that, as another method of arranging the alignment, the glass substrate 104 and the shadow mask 102 may be aligned, and the glass substrate 104 may be placed on the shadow mask 102, so as to form a combined structural member. After that, the weight plate 109 may be placed on the glass substrate 104 by a robot arm (not shown), so as to form the combined conveyance body 500.

Figure 8:
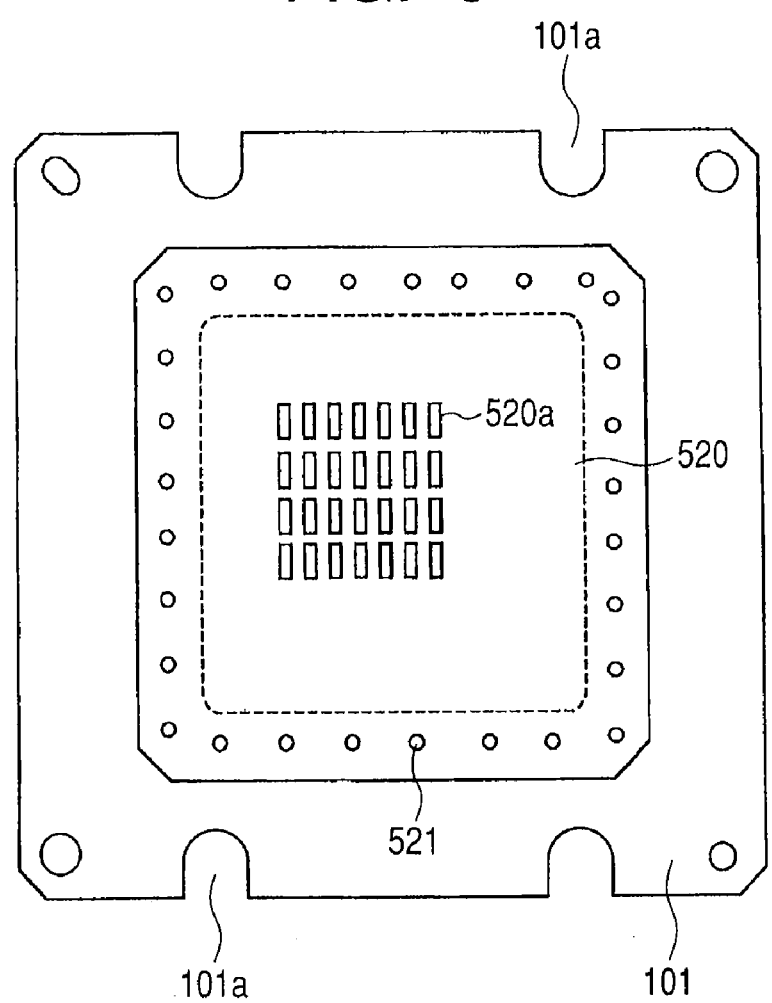
FIG. 8 is a schematic plan view illustrating an example of the mask holding member and a tension mask.
Figure 9:
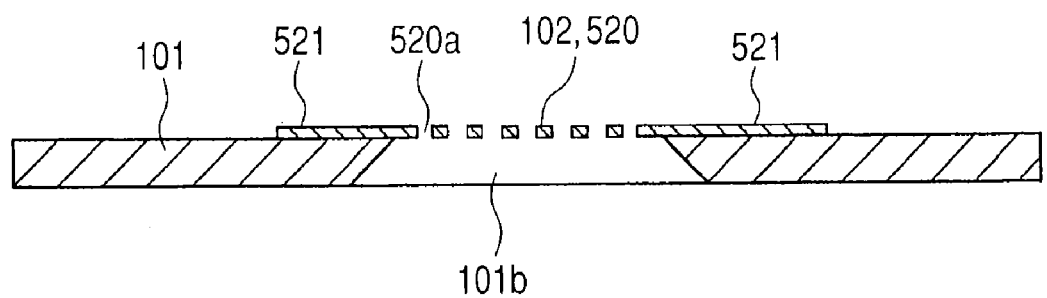
FIG. 9 is a schematic enlarged cross sectional view illustrating a part of the mask holding member and the tension mask.

Next, a detailed relationship between the shadow mask and the mask holding member is described. As illustrated in FIGS. 8 and 9, the tension mask 520 with a fine pattern is fixed to the mask holding member 101 by spot welding or laser welding.

The tension mask is provided with a lot of fine rectangular holes and slits for transmitting organic vapor, which are formed, by etching or a laser process, in a thin sheet having a thickness of approximately 25 to 80 μm and made of nickel or stainless steel. Furthermore, the tension mask is pulled with tension to be a flat shape and fixed to the mask holding member 101 by spot welding or laser welding.

FIG. 9 illustrates a cross section in the state where the tension mask 520 and the mask holding member 101 are coupled to each other at spot welding parts 521. In addition, substantially U-shaped notches 101*a* are formed on the rim of the mask holding member 101 and are engaged with the step parts 111*b* of the upper ends of the rods 111 provided to the main body only when the alignment is performed.

Figure 10:
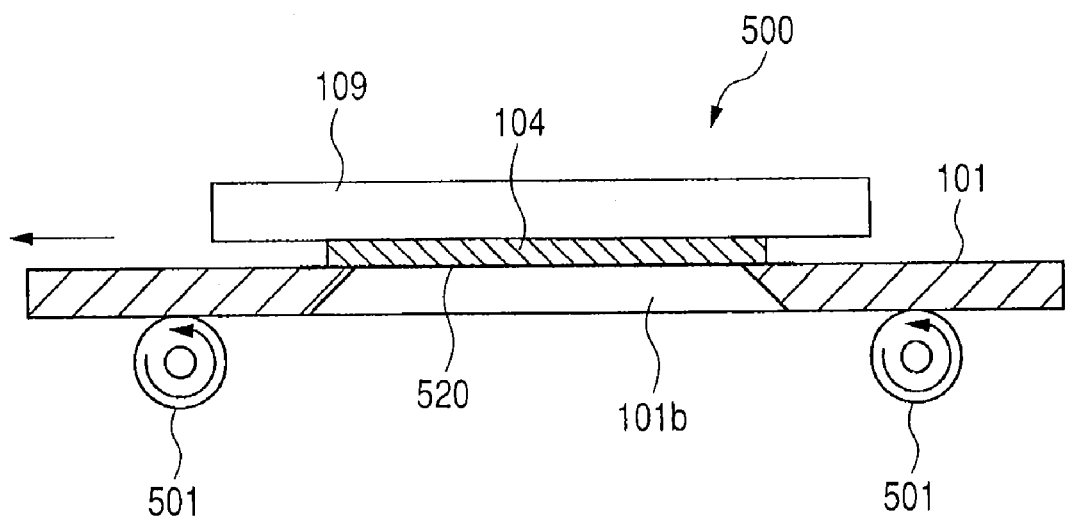
FIG. 10 is a schematic explanatory diagram illustrating the case where the combined conveyance body is placed on conveyor rollers.

After the alignment is finished to form the combined conveyance body 500, the rods 111 are lowered so that the combined conveyance body 500 becomes ready to be moved for conveyance as illustrated in FIG. 10. FIG. 5 is referred to again for detailed description. The weight plate 109 and the glass substrate 104 are supported by the small diameter parts 111*a* and the step parts 111*b* of the tips of the rods 111 that are inserted in the temporary positioning holes 109*a*. As understood from FIG. 5, the glass substrate 104 and the weight plate 109 may move up and down to any position by an actuator function of the alignment moving post 112. In other words, the glass substrate 104 is placed on the step parts 111*b* of the rods 111, and the weight plate 109 is placed on the glass substrate 104 so as to be aligned with the shadow mask 102 (tension mask 520) in this state.

The shadow mask 102 and the glass substrate 104 drive, in the separated state, the alignment post 112 to be any position for the alignment in the XY plane in FIG. 5, to thereby position the shadow mask 102 and the glass substrate 104 at a predetermined place. The glass substrate 104 and the weight plate 109 are aligned simultaneously in any XY plane with the shadow mask 102 at the same time. It is possible to change the apparatus structure and to use a unit for keeping the glass substrate 104 and the weight plate 109 still while controlling the position of the shadow mask 102 by moving the shadow mask 102 finely for alignment.

After the shadow mask 102 and the glass substrate 104 (including the weight plate 109) are aligned at a predetermined position with a predetermined positional accuracy, the alignment post 112 is lowered.

Along with that, the rods 111 are also lowered. Then, the weight plate 109 and the glass substrate 104 are also lowered to contact with the shadow mask 102 (FIG. 6 illustrates this state). Then, by the actuator function of the actuator 108 and the alignment moving post 112, the combined conveyance body 500 including the mask holding member 101 (with the shadow mask 102), the glass substrate 104, and the weight plate 109 is placed on the conveyor roller 501.

FIG. 8 is a plan view illustrating the mask holding member. The outside shape of the mask holding member 101 is substantially a rectangle, and a thin tension mask 520 with fine rectangular holes 520*a* is fixed thereto at the spot welding parts 521. The rectangular holes 520*a* are holes so as to transmit evaporation substances from an evaporation source toward the glass substrate 104 and must be accurately aligned so as to correspond to light emission unit pixels of organic EL elements to be driven by TFT elements formed on the glass substrate 104. In order to realize a small high definition organic EL panel, e.g., a three-inch VGA panel with a pixel numerical aperture of 50%, it is considered that alignment accuracy of approximately ±2 μm is required for mass production with good yield.

Figure 11:
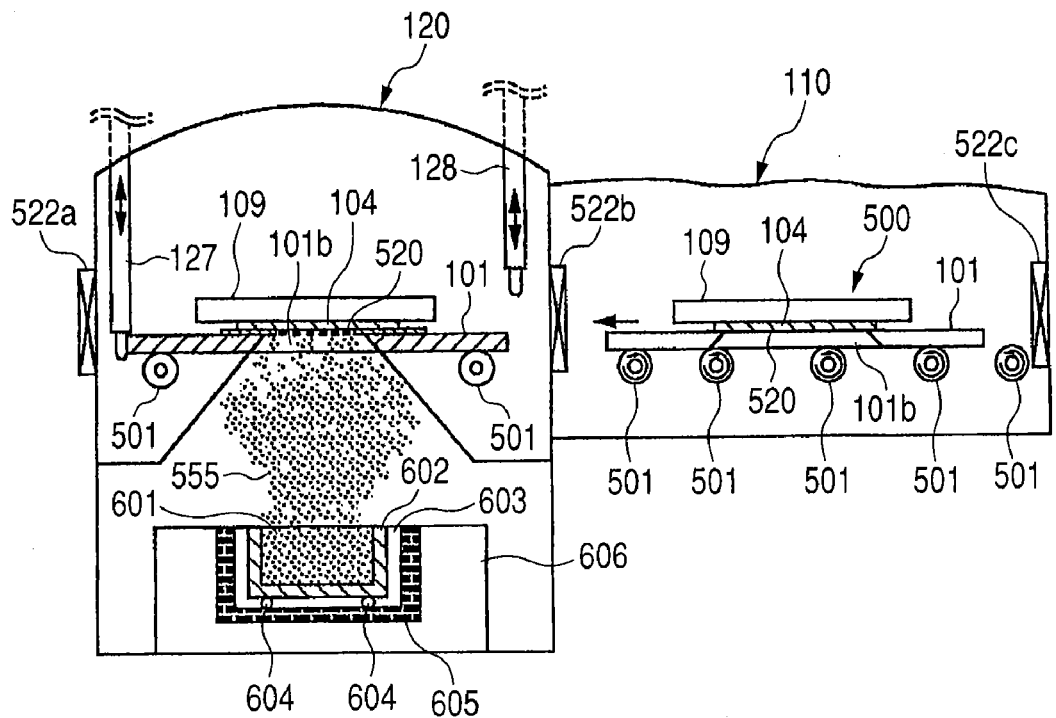
FIG. 11 is a schematic explanatory diagram illustrating a convey delivery chamber of the combined conveyance body and an organic evaporation chamber.

In FIGS. 9 and 11, the tension mask 520 is thin as 25 to 80 μm but are illustrated to be thicker intentionally for description.

FIG. 11 is a schematic explanatory diagram illustrating a conveyance chamber 110 for conveying the combined conveyance body 500 after the alignment to a next evaporation chamber 120, and the evaporation chamber 120 for an organic EL film. When the conveyor roller 501 is rotated, the combined conveyance body 500 is conveyed to the evaporation chamber 120 via an open/close shutter 522*b*. Then, the organic EL film is formed on the glass substrate 104 in the evaporation chamber with an evaporation source 606.

The evaporation chamber 120 is provided with the evaporation source 606 for supplying vapor 555 of an organic EL material 601 from below toward the combined conveyance body 500 that is conveyed by the convey mechanism disposed in the above. The evaporation source 606 generates the vapor 555 of the organic EL material supplied to the inside of a melting pot 602 by a heating element 605 enclosing the melting pot 602.

The combined conveyance body 500 after the alignment between the tension mask 520 and the glass substrate 104 is conveyed to the conveyance chamber 110 when an open/close shutter 522c is opened. Then, the above-mentioned combined conveyance body 500 becomes a standby state in the conveyance chamber 110 until a previous combined conveyance body 500 finishes a predetermined evaporation step of the organic EL film. When the vacuum evaporation process of the previous combined conveyance body 500 is finished, a shutter 522a is opened so that the previous combined conveyance body 500 is conveyed out from the evaporation chamber 120. In addition, the open/close shutter 522b is opened so that the above-mentioned combined conveyance body 500 is accelerated by the rotation of the rotation rollers 501, and is conveyed to the evaporation chamber 120 at a constant speed. Then, the rotation of the roller 501 is decelerated when approaching a predetermined position, and the above-mentioned combined conveyance body 500 finally strikes a positioning pin 127 at a speed of 0.1 to 0.2 m/sec to be stopped. Then, a rear positioning pin 128 is lowered so that rear positioning is also performed. When pins 127 and 128 are lowered at predetermined positions, the evaporation is started by a startup switch.

According to Japanese Patent Application Laid-Open No. 2007-046099, the collision occurs at a speed of 0.1 to 0.2 m/sec in the sandwiching action of the clutch roller. If the weight plate 109 of the present invention is not used, the collision occurs between metals when the combined conveyance body 500 strikes the positioning pin 127, and impact occurs due to deceleration of approximately 1 to 10 m/sec$^2$. In other words, the technology described in the technical document 1 causes a displacement of ±2 μm or larger between the mark in the shadow mask and the mark in the glass substrate. However, if the weight plate 109 of the present invention is used, the displacement became ±2 μm or smaller.

When the vacuum evaporation process is finished, the pins 127 and 128 are raised, and the shutter 522a is opened. Then, simultaneously with the rotation of the rotation roller 501, the combined conveyance body 500 is conveyed to a next conveyance chamber so that a next organic EL film is formed by vacuum evaporation. A method of stopping in each evaporation chamber is described in this embodiment, but it is possible to adopt a method of conveying continuously at a constant speed in every step. However, in order to avoid mixture of another color or another function of the organic EL film or contamination due to organic EL vapor particles in the alignment chamber, it is preferred to adopt the method of stopping at the open/close shutter and waiting in the conveyance chamber.

As a result of actual measurement for improving production tact of conveyance in the apparatus, it is found that an impact acceleration of approximately 1 to 3 m/sec$^2$ occurs due to deceleration or acceleration in the conveyance.

In the case of the combined conveyance body using the weight plate according to the present invention, it is possible to reduce the impact to 0.5 m/sec$^2$ or lower without decreasing the production tact. Thus, it becomes possible to realize displacement due to the convey step of ±2.0 μm or smaller.

Figure 12:
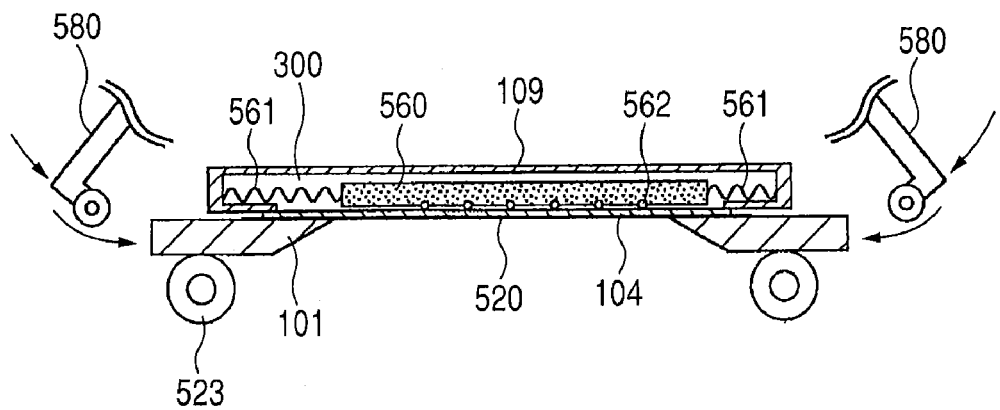
FIG. 12 is a cross sectional view illustrating a weight plate and a rotation clutch according to a third embodiment.

FIG. 12 illustrates a weight plate according to a third embodiment. This embodiment corresponds to the structure in which the surface of the sliding body 560 facing the glass substrate is exposed in the weight plate of the second embodiment illustrated in FIG. 3. In other words, only a peripheral part of the weight plate 109 contacts with the glass substrate 104, and in other parts contact directly with the slide balls 562 which performs rolling action, to thereby slide and move the contact surface of the glass substrate 104 while pressing the tension mask 520 by gravity.

According to the weight plate in this embodiment, the slide balls 562 directly press the glass substrate 104 so that the contact between the glass substrate 104 and the tension mask 520 is performed completely. Thus, an impact may be absorbed while eliminating the gap.

Figure 13:
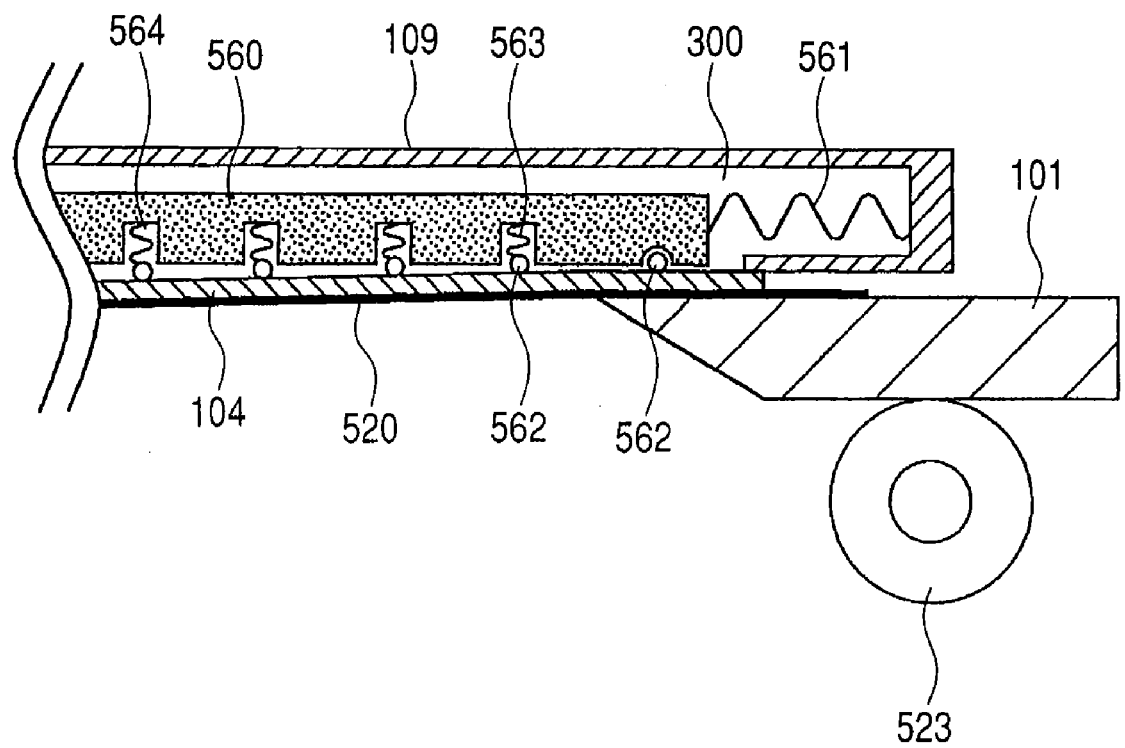
FIG. 13 is a schematic enlarged cross sectional view illustrating a weight plate according to a fourth embodiment.

As illustrated in FIG. 13, if the thickness of the glass substrate 104 is thin, or if the area of the glass substrate 104 is large, the glass substrate 104 may be sagged. In particular, the center part that is not supported by the mask holding member 101 is apparently sagged. Because the tension mask 520 is also spot-welded to the mask holding member 101, a strong tension may not be applied thereto. Therefore, a sag of approximately 0.1 to 0.2 mm usually occurs in the center part and the vicinity thereof.

FIG. 13 is a schematic enlarged cross sectional view illustrating a weight plate according to a fourth embodiment. The sliding body 560 is provided with multiple recesses 564 each including a spring 563 and a slide ball 562 set therein. The slide balls 562 securely press the sagged glass substrate 104 so as to maintain contact between the mask part in which only the tension mask 520 is disposed (tension mask area other than a so-called mask frame) and the glass substrate 104. Note that the description uses the sliding body 560 of this embodiment, but it is possible not to provide the sliding body 560 in particular but to provide the springs 563 and the slide balls 562 directly to the weight plate. In this case, it is possible to provide multiple recesses 564 to the weight plate and to dispose the spring 563 and the slide ball 562 in the recesses 564.

The recess 564 has a cylindrical shape in FIG. 13, but actually a hole having a diameter smaller than that of the slide ball 562 is formed so that the slide ball 562 is enclosed inside the hole. Then, the spring 563 is disposed between the slide ball 562 and the bottom surface of the recess 564 so that a part of the slide ball 562 protrudes from the surface of the sliding body 560 facing the substrate. With this structure, the slide ball 562 may securely press a part of the glass substrate 104 even if the glass substrate 104 is slightly sagged to generate a curve of a concave shape.

In addition, the tension mask 520 and the surface of the glass substrate 104 on the TFT side may cause a beat vibration due to a difference of natural frequency between the tension mask 520 and the glass substrate 104. However, the surface of the glass substrate 104 on the TFT side and the tension mask 520 are securely pressed to contact with each other at the center and the vicinity thereof of the tension mask 520.

Here, the slide ball 562 is made of stainless steel having a diameter of 8 mm, and the diameter of an opening of the sliding body 560 is adjusted to be smaller than the diameter of the slide ball so that a maximum protrusion of the slide ball become 0.8 mm. In addition, the pressing force of the spring 563 is 8 to 10 gf in the case of the protrusion of 0.8 mm. The value is changed arbitrarily in accordance with the number of balls.

The number of the slide balls 562 disposed is 260. As a result, the pressing force of pressing the tension mask 520 is approximately 2.3 kgf including weight of the balls. The pressing force that is applied to the peripheral part of the mask holding member 101 (mask frame part) is set to approximately 4 kgf including the slide balls 562 (slide balls for pressing the mask frame part) and the weight plate 109 for pressing the glass substrate 104 illustrated in FIG. 13.

Figure 14A:
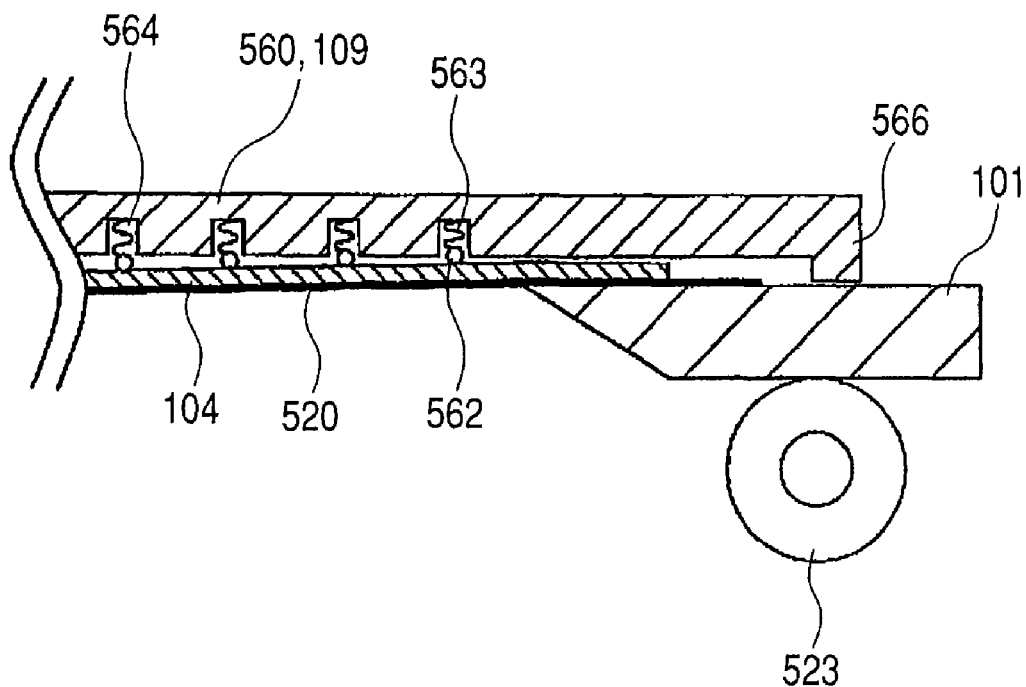
FIGS. 14A and 14B are schematic enlarged cross sectional views each illustrating a weight plate according to a fifth embodiment.
Figure 14B:
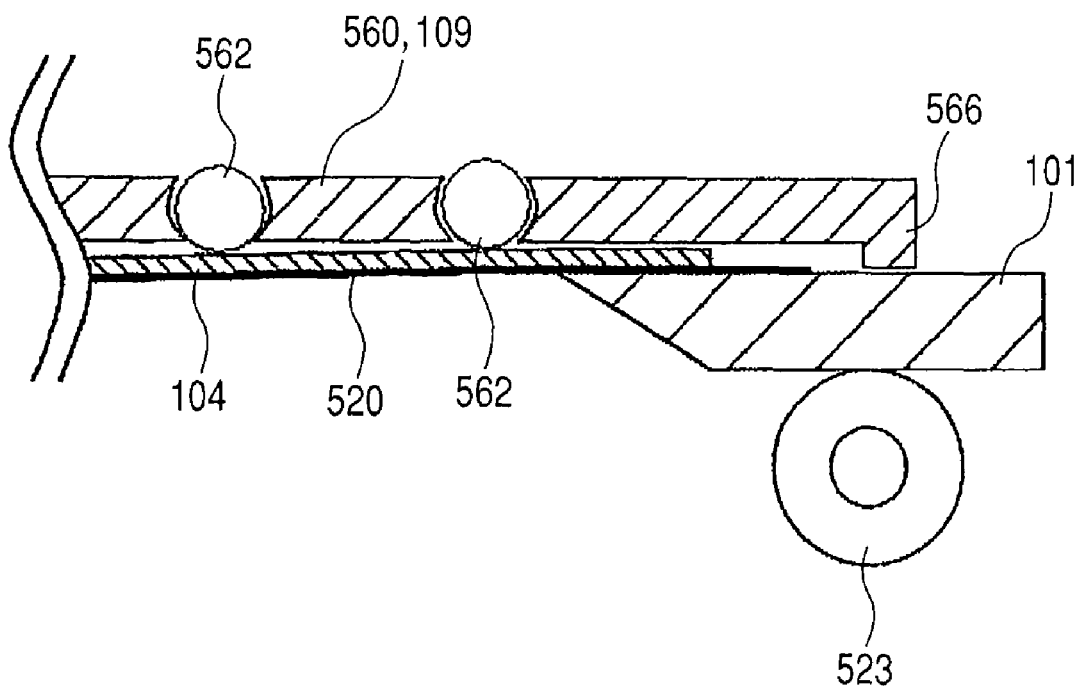
Figure 15:
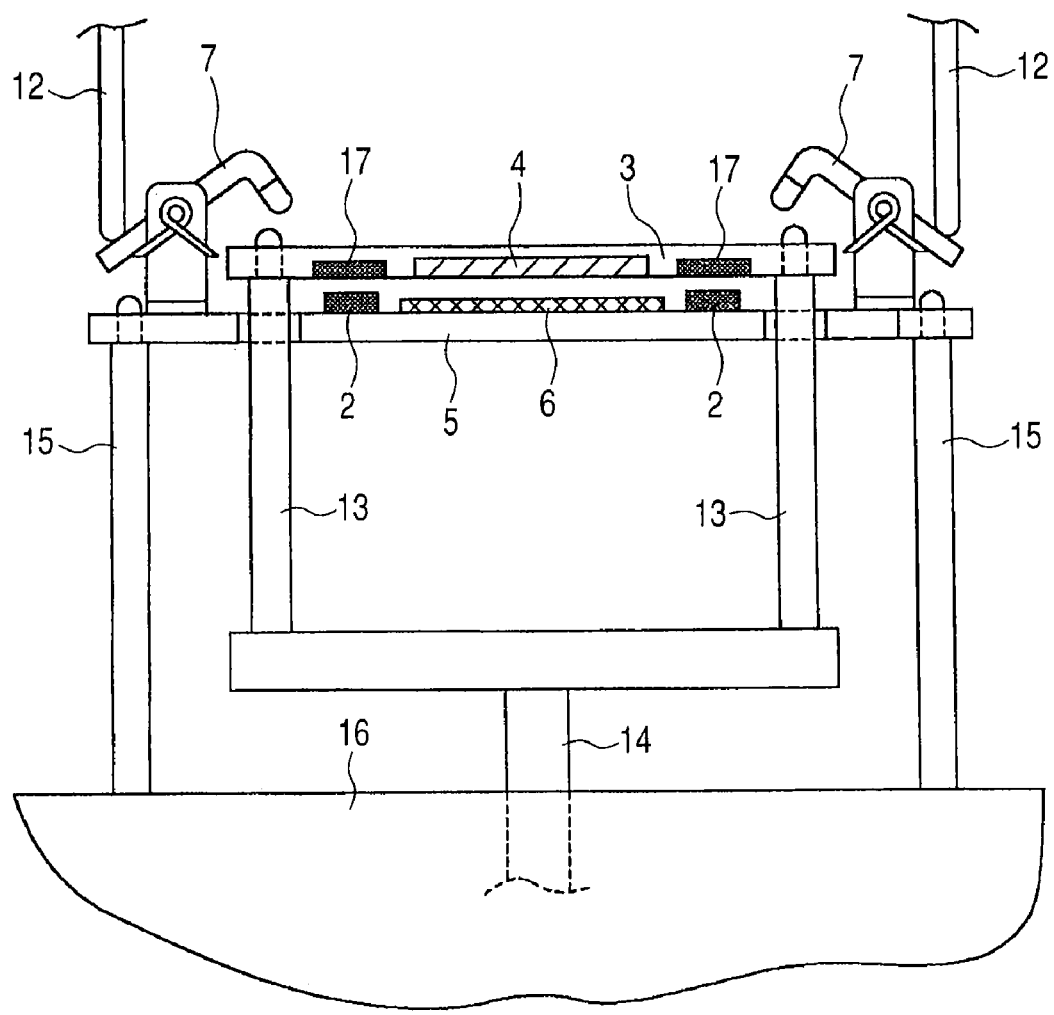
FIG. 15 is an explanatory diagram illustrating a conventional substrate holder.

FIGS. 14A and 14B are enlarged cross sectional views illustrating a weight plate according to a fifth embodiment. In this embodiment, the peripheral part of the glass substrate 104 is not pressed directly by the weight plate 109 but a contact leg part 566 as a protruding part for contacting with the mask holding member 101 is provided to the peripheral part of the weight plate 109. As a result, the weight of the weight plate 109 is supported by the mask holding member 101 directly. This protruding part may prevent the weight plate 109 from contacting directly with the glass substrate 104. Thus, the glass substrate 104 always contacts with the slide balls 562 directly, and a constant distance is maintained in the vertical direction of the glass substrate. Therefore, it is possible to obtain another effect that the spring force toward the glass is maintained to be constant force, so as to prevent an increase of friction force between the glass substrate 104 and the tension mask 520.

Note that this embodiment is described by using the sliding body 560 similarly to the fourth embodiment, but it is possible not to provide the sliding body 560 in particular but to provide the springs 563 and the slide balls 562 directly to the weight plate. In this case, it is possible to provide multiple recesses 564 to the weight plate and to dispose the spring 563 and the slide ball 562 in the recess 564.

In FIG. 14A, in the vertical direction of the glass substrate 104, the slide balls 562 positioned to be opposed to the tension mask 520 press the glass substrate 104 by predetermined spring force of the springs 563.

In addition, the pressing force of the slide ball 562 in the vertical direction of the glass substrate 104 is set to be approximately 48 to 51 gf when the protrusion of the slide ball 562 from the surface of the weight plate 109 is 0.8 mm in this embodiment.

The number of the slide balls 562 is 25 and the slide balls are arranged with the same interval of 50 mm in the length direction and the width direction only in the center part and the vicinity thereof of the glass substrate 104, to thereby press the glass substrate 104 at 1,250 gf.

The arrangement of the slide balls 562 and the setting of the pressing force of the spring 563 may be set arbitrarily in accordance with relationships of thickness and size of the glass substrate 104, stiffness of the same, size of the mask holding member 101, and tension of the tension mask 520.

With this structure, influence of vibration and impact during the conveyance of the mask frame 101 is hardly transmitted to the glass substrate 104 directly.

In particular, the momentum of the weight plate 109 in the lateral direction (in-plane direction of the glass substrate) at the time of the striking collision is transmitted to, via the spring 563 and the slide ball 562, the glass substrate 104. Therefore, displacement of the glass substrate 104 in the lateral direction may be reduced. In addition, because the spring 563 presses the glass substrate 104 to the tension mask 520 by predetermined pressing force, the friction force is increased so that displacement resistance due to the striking collision increases, thereby resulting in little displacement.

According to the experiment, vibration impact when conveying at a constant convey speed 50 mm/sec on a metal roller was up to ±0.5 m/sec$^2$, but displacement was ±0.2 μm or smaller in the optical mark measurement before and after the conveyance. This means that the substantial displacement is almost zero because an error of the optical measurement by a wavelength of a visible light beam is within the range of ±0.2 μm. In addition, the collision to the metal pole was performed at a convey speed of 10 to 20 mm/sec. A maximum impact acceleration at that time was ±8.3 m/sec$^2$ at the mask holding member 101. The displacement at that time was ±0.2 μm or smaller. In other words, it was found that displacement to be a problem in the substantial collision had not occurred.

When the weight plate 109 provided with a slide moving body receives an impact, friction force increases because the slide balls 562 roll and because of a shock absorbing effect of the springs 563 and pressing force of the springs 563. As a result, the tension mask 520 and the glass substrate 104 are not moved relatively to each other, and hence no displacement occurs. Otherwise, it is possible to reduce the displacement largely.

In addition, if all the slide balls 562 have diameters in the range of approximately 15 to 30 mmφ, or if the number of balls having diameters in the range of 5 to 8 mmφ is increased, it is possible to eliminate the springs so that the glass substrate 104 is pressed by only the balls. For instance, it is possible to use slide balls having diameters of approximately 18 mmφ having the shape as illustrated in FIG. 14B. Because the hole diameter on a top surface and a lower surface of the weight plate 109 is smaller than the diameter of the slide ball 562, the slide ball 562 moves and rotates inside vertically but does not drop out externally.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-043436, filed on Feb. 26, 2009, which is hereby incorporated by reference herein in its entirety.

What is claimed is:

1. A vacuum evaporation apparatus according, comprising:
an evaporation source;
a combined conveyance body in which a glass substrate is superposed and aligned on a shadow mask fixed to a holding member, and a weight plate placed on the glass substrate presses the glass substrate to the shadow mask by gravity for holding the glass substrate; and
a convey mechanism for conveying the combined conveyance body,
wherein the weight plate includes a shock absorbing member for absorbing an impact applied to the combined conveyance body in an in-plane direction of the glass substrate, and
wherein the shock absorbing member is a liquid metal disposed in a hollow part formed in the weight plate at a filling factor within a range of from more than 25% to less than 85%.

2. A vacuum evaporation apparatus, comprising:
an evaporation source;
a combined conveyance body in which a glass substrate is superposed and aligned on a shadow mask fixed to a holding member, and a weight plate placed on the glass substrate presses the glass substrate to the shadow mask by gravity for holding the glass substrate; and
a convey mechanism for conveying the combined conveyance body,
wherein the weight plate includes a shock absorbing member for absorbing an impact applied to the combined conveyance body in an in-plane direction of the glass substrate, and
wherein the shock absorbing member comprises a sliding body connected to the weight plate via a spring and including multiple recesses formed in a surface of the sliding body facing the glass substrate, and having slide balls disposed in the multiple recesses, with the slide balls being pressed by either one of springs and gravity so that a part of each of the slide balls protrudes from the surface.

3. The vacuum evaporation apparatus according to claim 2, wherein a diameter of openings in the recesses is smaller than a diameter of the slide balls.

4. The vacuum evaporation apparatus according to claim 2, further comprising an alignment mechanism for determining a positional relationship between the glass substrate and the shadow mask.

5. The vacuum evaporation apparatus according to claim 2, wherein the shadow mask is a tension mask for forming an organic EL material into respective unit pixels of an organic EL panel.

6. A vacuum evaporation apparatus, comprising:
an evaporation source;
a combined conveyance body in which a glass substrate is superposed and aligned on a shadow mask fixed to a holding member, and a weight plate placed on the glass substrate presses the glass substrate to the shadow mask by gravity for holding the glass substrate; and
a convey mechanism for conveying the combined conveyance body,
wherein the weight plate includes a shock absorbing member for absorbing an impact applied to the combined conveyance body in an in-plane direction of the glass substrate, and
wherein the shock absorbing member comprises springs disposed in multiple recesses formed in a surface of the weight plate facing the glass substrate, and slide balls connected to the springs.

7. The vacuum evaporation apparatus according to claim 6, wherein the weight plate includes a protruding part toward the glass substrate, which is brought into contact with the holding member of the shadow mask.

* * * * *